United States Patent [19]

Mortensen

[11] Patent Number: 4,724,963
[45] Date of Patent: Feb. 16, 1988

[54] WAFER PROCESSING CASSETTE

[75] Inventor: Roger L. Mortensen, Victoria, Minn.

[73] Assignee: Empak, Inc., Chanhassen, Minn.

[21] Appl. No.: 912,130

[22] Filed: Sep. 29, 1986

Related U.S. Application Data

[63] Continuation of Ser. No. 703,508, Feb. 20, 1985, abandoned.

[51] Int. Cl.[4] .............................................. B65D 85/30
[52] U.S. Cl. .................................... 206/454; 206/334; 211/41
[58] Field of Search ....................... 206/334, 454, 564; 211/40, 41

[56] References Cited

U.S. PATENT DOCUMENTS

| | | | |
|---|---|---|---|
| 3,923,156 | 12/1975 | Wallestad | 206/454 |
| 3,939,973 | 2/1976 | Wallestad | 206/454 |
| 3,961,877 | 6/1976 | Johnson | 206/454 |
| 4,471,716 | 9/1984 | Milliren | 206/454 |
| 4,493,418 | 1/1985 | Johnson | 206/454 |

*Primary Examiner*—Jimmy G. Foster
*Attorney, Agent, or Firm*—Hugh D. Jaeger

[57] ABSTRACT

Wafer processing cassette for the processing of silicon wafers, which includes a plurality of open, reinforced, dual cross-section profiled wafer dividers for structural integrity and for supporting a plurality of wafers in alignment in opposing mirror image dividers of the cassette for automated robotic processing of the wafers while in the cassette. The cassette utilizes a cross-bar end with a configured rod reinforced open cross-bar, which is fully functional and strategically located for structural integrity. The dividers are supported by two pairs of longitudinal horizontal supports secured to ends providing for a multi-level, flow-through, open area between each of the dual profile geometrically configured dividers for ease of entry and passage of liquids during automated processing. Rapid fluid flow and drying of the cassette is effected using extra smooth cassette surfaces, rounded edges, filled corners, drain recesses, drain scuppers, and ramped surfaces. The rear area includes a downward arch. The processing wafer cassette provides for on-center processing where the carrier center of gravity is on-center of the axis of centrifugal wafer processing machinery. Each of the dual profile dividers and wash slots cross-sections are geometrically configured for passage of chemicals during processing.

9 Claims, 9 Drawing Figures

FIG. 2

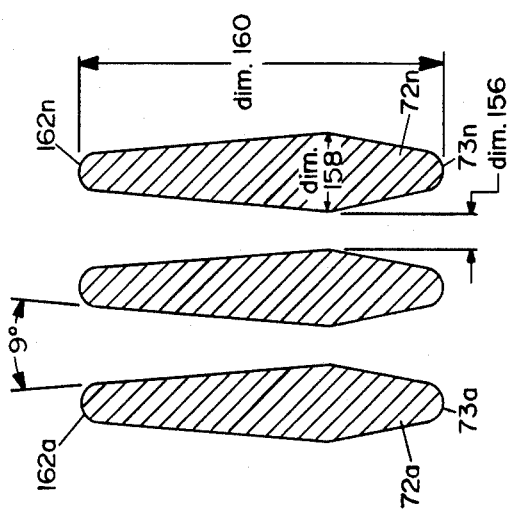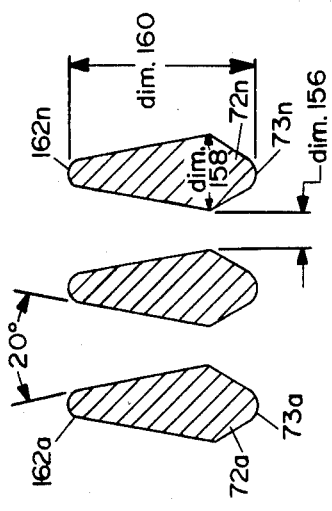

WAFER PROCESSING CASSETTE

CROSS-REFERENCE TO CO-PENDING APPLICATIONS

This application is a continuation of application Ser. No. 703,508, filed 2-20-85, abandoned.

BACKGROUND OF THE INVENTION

1. Field of the Invention

The present invention relates to a high profile wafer processing cassette for processing of silicon wafers utilized in integrated circuits, and more particularly, pertains to a high profile wafer processing cassette with dual cross-section profile geometrically configured teeth and side members, including multi-level, flow-through process wash areas, quick drying surfaces, and reinforced upper edge members for carrying a plurality of silicon wafers for integrated circuit processing in known processes including on-center, centrifugal, bath immersion, and in-line one-wafer-at-a-time processing.

2. Description of the Prior Art

The prior art wafer cassettes have been heavy, bulky, and expensive, and did not provide for sufficient open area for efficient processing of the wafers. Prior art cassettes are not prone to maintaining structural integrity because of structural limitation and often distort or flex in shape to the point of structural fatigue causing breakage of the silicon wafer and failure of the carried circuitry. Sufficient amounts of improperly channeled process wash chemicals are barred from penetrating the interior cavities of the cassette in an efficient, sufficient, and expeditious manner with respect to the sheer bulk construction used in prior art cassettes, as well as blunt exterior teeth edges or limited access end portions. Drainage and drying times of prior art cassettes are unduly lengthy owing to unpolished, irregular cassette surfaces, squared non-rounded corners, unradiused edges and horizontal non-ramped surfaces.

The present invention overcomes the disadvantages of the prior art by providing a high profile wafer processing cassette for processing silicon wafers, or the like, which includes an cross-bar end, an opposing reverse arch end, and a high profile structure providing for non-restrictive, multi-level, open area liquid passage areas between each of the dual profile cross-section reinforced geometrically configured dividers. Drainage fluid flow and drying times are decreased by the use of extremely smooth surface areas, vertex radiused slots, ramped surfaces, filled and radiused corners, rounded edge members, lower recessed edges, and drain scuppers. The cassette provides for on-center processing of integrated circuit wafers in automated integrated circuit processing equipment, and includes robotic handling recesses and notches. The wafer cassette can be made from Teflon PFA, or like materials, which withstands chemical etching processes in addition to being accepted by present day robotic wafer automated machines.

SUMMARY OF THE INVENTION

The general purpose of the present invention is to provide a high profile wafer cassette for processing of integrated circuit wafers such as silicon wafers, or the like, which provides high profile structure for on-center processing of the cassette by advanced generation, integrated circuit, robotic wafer processing equipment. The wafer processing cassette includes an integral structure with strategically located components of the cross-bar end and geometrically configured, and dual cross-section profile reinforced wafer dividers with multi-level chemical process spray ports providing for maximized inner cassette wash entry for integrated circuit processing. Smoothed surfaces, rounded edge and corner members, radiused vertex slots, lower edge recesses, and scupper drains are utilized throughout for facilitating fast, efficient drainage and drying of the cassette. The wafer cassette is of an extremely open profile and of minimal weight providing for a lower unit cost to the integrated circuit processor.

According to one embodiment of the present invention, there is provided a wafer cassette for processing of integrated circuit wafers, such as silicon wafers, including a substantially rectangular configured cross-bar front end including a ramped upper portion, a rectangular lower portion, a partial cylindrical reinforcing rod running the longitudinal length of the center of the cross-bar end, upper edge members having locating pins and holes and handling tool recesses, a plurality of dual cross-section profile wafer dividers having geometrically shaped teeth, the reinforced exterior portion being of less tooth depth than the interior tooth depth, pairs of opposing horizontal longitudinal structural supports secured to the front cross-bar and a rear end at upper and lower mid-portions of the dividers above a reinforced bottom for wafer perimeter contact containing drainage recesses and ramped positioning holes. Multi-level wash ports position between the dual cross-section profile teeth, upper and lower edge members, and upper and lower horizontal structural supports, whereby the multi-level wash ports, open cross-bar end, and downwardly arched rear end provide for maximum open side and end chemical processing entry areas. The open dual profile dividers with geometrically configured teeth of dual rounded faces provide for maximum wafer surface area exposure for processing functions, thereby providing a fully functional, strategically located, high structure profile, and least weight wafer cassette of structural integrity for on-center processing of integrated circuit wafers. The plurality of reinforced dividers have unique shaped teeth, the exterior portion being rounded in shape providing for additional strength, and efficient and effective ease of entry for chemicals used in wafer processing. A plurality of lower edge recesses, ramped position holes, radiused vertex slots, ramped surfaces, scuppers, and radiused inside and outside corners and edges position on and about the cassette providing smooth surfaces for expedited drainage of fluids. Notches and recesses position on the cassette for the accommodation of external handling devices.

One significant aspect and feature of the present invention is a wafer processing cassette which is fully functional, and includes a strategically located cross-bar end for structural integrity and an open area for non-restricting processing of silicon wafers for integrated circuits. Structural integrity is insured by the wide cross-sections of the dividers and a partial cylindrical rod secured across the cross-bar end. The cassette itself has more open area for fluid passage.

Another significant aspect and feature of the present invention is a wafer processing cassette which provides for on-center processing of integrated circuits. The wafer cassette provides that the center of gravity of the wafer cassette carrier is on-center of the axis of integrated circuit centrifugal processing machinery. Vertical tabs are provided to assist for robotic automation. The cassette itself is of least weight and balance about its center.

An additional significant aspect and feature of the present invention is a wafer processing cassette which has a high structure profile, and is of minimal weight with maximum structural integrity for automated processing equipment.

A still additional significant aspect and feature of the present invention is a wafer processing cassette which has a high profile open cross-bar end for automatic wafer handling equipment. While industry standard equipment requires the standard cross-bar configuration profile, the high profile cross-bar falls within the required industry profile for automated processing equipment.

Still another significant aspect and feature of the present invention is a wafer processing cassette which includes the use of extremely smooth surface areas and sloping and rounded surfaces, corners, and vertex radiused indexing slots for drainage of fluids from the surfaces. The corners are sloped, rounded, smooth, and filled, thereby preventing particle or particulate contamination during processing of the wafers.

A yet further significant aspect and feature of the present invention is a wafer processing cassette with dual profile tooth like dividers, having teeth like dividers and a ramped tooth top tip, with a large profile, including exterior rounded teeth backs which provide for further rigidity of the dividers and the wafer cassette carrier, as well as effective fluid drainage while having small interior teeth profiles.

A further significant aspect and feature of the present invention is a wafer processing cassette which provides a considerable open end area and full height multi-level open process wash ports between rounded teeth. Also, all backside edges of dividers are radiused for expedited fluid drainage.

A further significant aspect and feature of the present invention is a wafer processing cassette which uses through-wall drain hole which is fed by a flat angled surface. The wafer cassette includes a plurality of open aligned wash slots.

Other significant aspects and features of the present invention are numerous lower edge and end member recesses enhancing rapid liquid evacuation from the cassette during processing. Also, geometrically configurured, angled rounded tooth backs allow for efficient process wash fluid entry at all levels of the dual profile teeth multi-level wash ports. Additionally, vertically placed support bars strengthen upper edge members at the forward locating pin and slot areas facilitating further stress handling capabilities during wafer processing.

Having thus described embodiments of the present invention, it is a principal object hereof to provide a high profile wafer cassette having structural integrity for integrated circuit processing, such as silicon wafers.

One object of the present invention is a fully functional, on-center processing wafer processing cassette which provides for non-restrictive processing during robotic automated steps of integrated circuit wafer processing. Also, this wafer cassette will retrofit to existing machine structures for wafer processing.

An additional object of the present invention is a wafer processing cassette which is produced from Teflon PFA, or like material, at an economical price cost, and which withstands high temperatures and acidic chemicals, such as sulfuric acid, during chemical processing of wafers.

Another object of the present invention is a wafer processing cassette which exhibits rapid drainage and drying qualities about the cassette.

A further object of the present invention is a wafer processing cassette which uses dual profile teeth providing for structural integrity of the wafer processing cassette.

A further object of the present invention is a wafer processing cassette which provides for external thorough chemical process wash through large open ends and multi-level side wash port areas.

BRIEF DESCRIPTION OF THE DRAWINGS

Other objects and many of the attendant advantages of the present invention will be readily appreciated as the same becomes better understood by reference to the following detailed descriptions when considered in connection with the accompanying drawings, in which like reference numerals designate like ports throughout the figures thereof and wherein:

FIG. 1A illustrates a partial view of the upper left portion of the cassette;

FIG. 2 illustrates a top view of the high profile wafer cassette;

FIG. 7 illustrates a section view of the dual profile teeth taken along line 7—7 of FIG. 5; and, FIG. 8 illustrates a section view of dual profile teeth taken along line 8—8 of FIG. 5.

DESCRIPTION OF THE PREFERRED EMBODIMENTS

Figure 1:
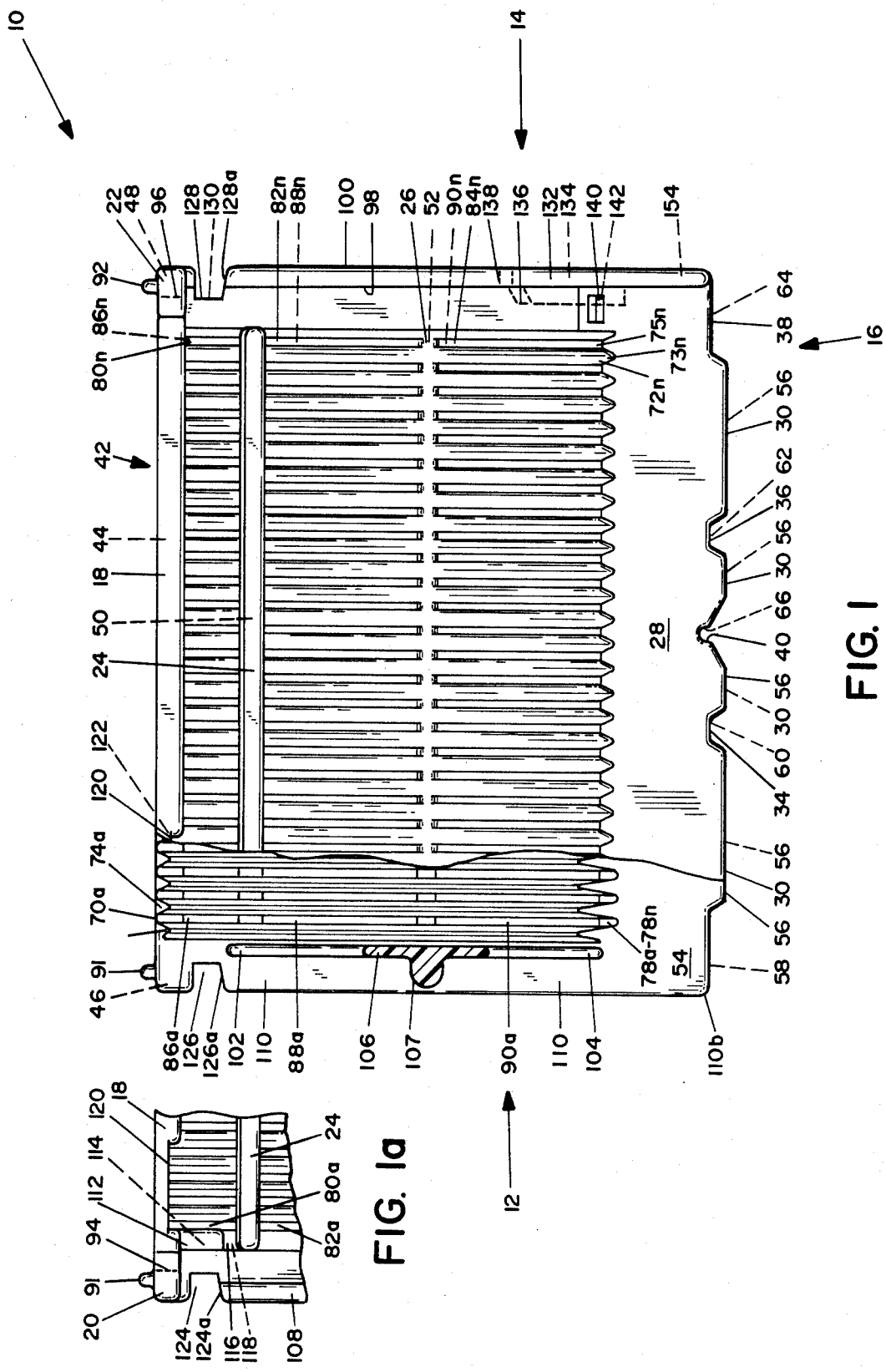
FIG. 1 illustrates a plan view of the high profile wafer cassette including a partial cutaway section.
Figure 2:
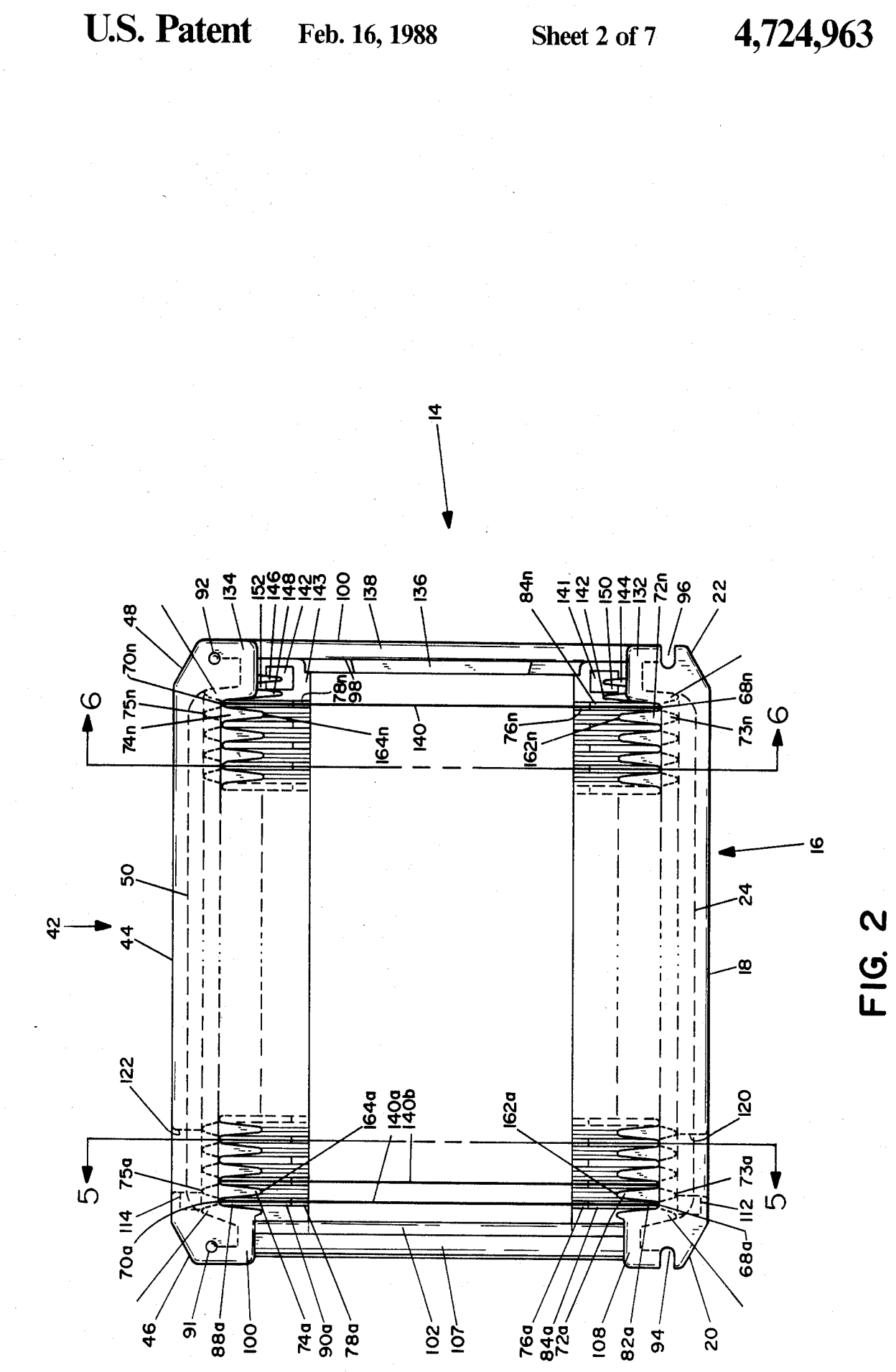

FIG. 1 illustrates a plan view of a high profile wafer processing cassette 10, the present invention, for processing of integrated circuit wafers, such as silicon wafers, including a partial cut away section. Reference is also made to FIGS. 1A-8 in the following description. The wafer processing cassette 10 includes an cross-bar end 12, also illustrated in FIG. 3, which includes open areas, a rear end 14 which includes open areas, also illustrated in FIG. 4, an angled rounded right side 16 including a right upper edge member 18, beveled corner surfaces 20 and 22 positioned at the outward ends of member 18, a right upper beveled top horizontal structure support 24, a right lower partial section of a cylindrical support rod 26, a right horizontal lower edge member 28, a right lower rounded bottom edge 30 including liquid drainage recesses 32, 34, 36, 38, and ramped centering position hole 40 which is also a liquid drainage recess. An angled rounded left side 42 includes left upper edge member 44, left side upper edge member beveled corner surfaces 46 and 48 located at the outward ends of member 44, a left upper beveled top horizontal structure support 50, a left horizontal lower partial section of a cylindrical support rod 52, a left lower edge member 54, a left lower rounded bottom edge 56 including liquid drainage recesses 58, 60, 62, 64, and ramped centering positioning hole 66 which is also a liquid drainage recess. A plurality of right radiused vertex indexing slots 68a–68n oppose left radiused vertex indexing slots 70a–70n, and are also provided for in the lower edge members 28 and 54. A plurality of geometrically configured wafer dividers, the cross-section of the upper portion being different than that of the lower divider cross-section, assume geometrical shapes of rounded teeth 72a–72n and 74a–74n with rounded teeth backs 73a–73n and 75a–75n, the teeth being rounded on the exterior and interior teeth end points as illustrated further in FIGS. 7 and 8. The teeth are in opposing alignment with respect to each other as also shown in FIG. 2, and supported in turn by upper edge members 18 and 44. Beveled structure horizontal support members 24 and 50, lower partial cylinder support rod members 26 and 52, and lower edge member 28 and 54 extend between the cross-bar end 12 and the rear end 14. Lower slot support seat areas 76a–76n and 78a–78n are radiused to conform to the specific radius size of the wafer being processed. Lower horizontal partial cylinder support rods 26 and 52 lend slight additional tangential contact support to the wafer edges, keeping the wafers secure within the indexing slots 68a–68n and 70a–70n. These supports extend outwardly along a portion of the horizontal length as illustrated in the figures.

Right side upper wash process ports 80a–80n, mid-wash process ports 82a–82n, and lower process wash ports 84a–84n are formed between the grids fashioned by teeth 72a–72n and right upper edge member 18, right beveled horizontal support structure 24, right lower partial section support rod 26 and right lower edge member 28. In a similar fashion, left side upper wash process ports 86a–86n, mid-wash process ports 88a–88n, and lower wash process ports 90a–90n are formed between the grids formed by teeth 74a–74n and left upper member 44, left beveled horizontal support structure 50, left lower partial section support rod 52 and left lower edge member 54, providing for maximum fluid flow and pressurized liquid processing chemical or other liquid entry at upper, middle, and lower side areas 16 and 42 of the wafer cassette 10. The narrow profile, non-blunt, teeth allow maximum ease of liquid processing chemical entry as discussed later.

Figure 3:
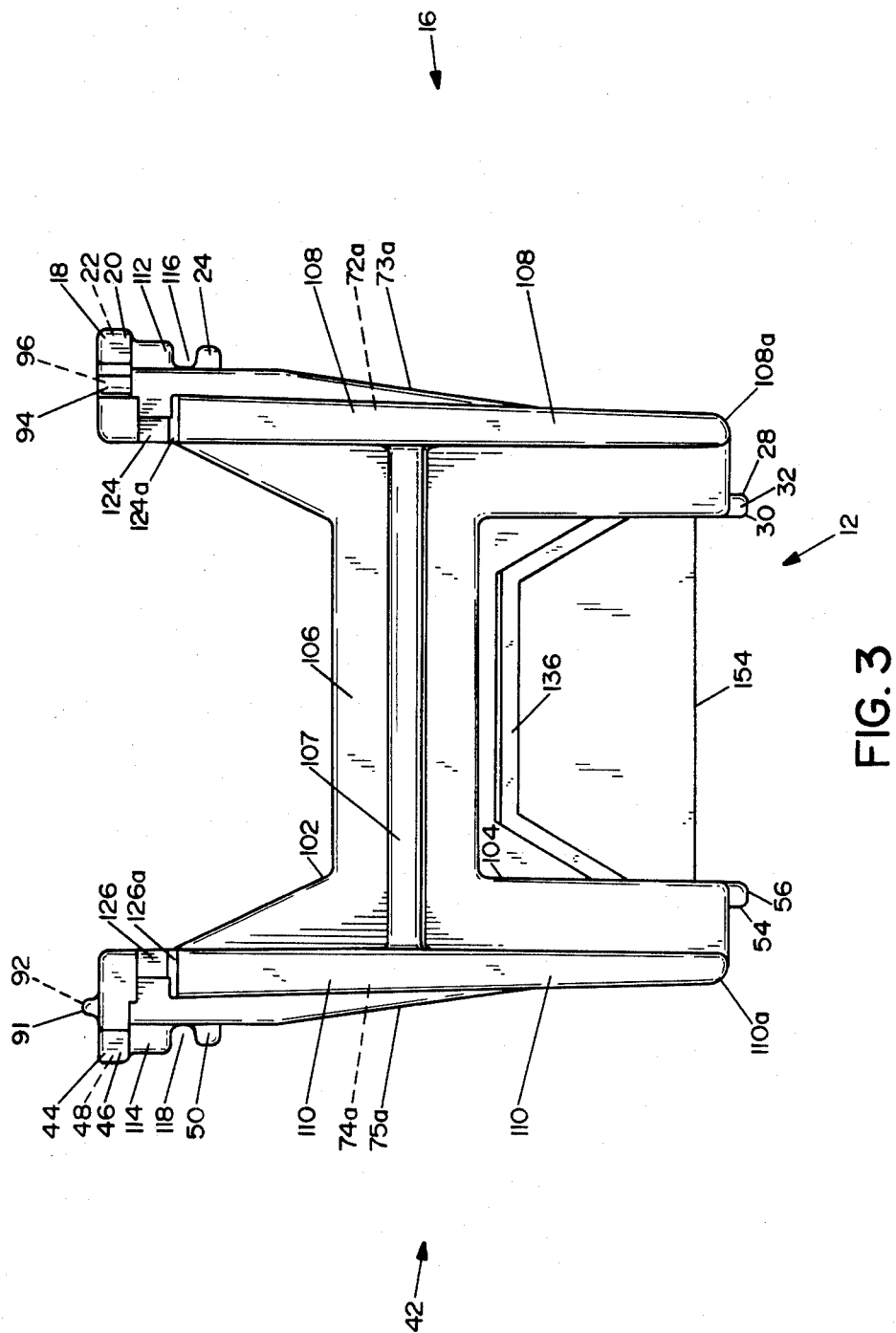
FIG. 3 illustrates front view of the cross-bar end.

The wafer processing cassette 10 includes locating pins 90 and 92 and locating notches 94 and 96 positioned on or in upper edge members 44 and 18. The cassette 10 also includes interior side 98 and exterior side 100 located at the rear end 14. The cross-bar end 12 includes a rounded ramped top edge 102 and an open area above and a rounded lower edge 104 with a rectangular like open area beneath, as illustrated in FIG. 3. The cross-bar horizontal center member 106 includes a partial section of a cylindrical rod 107 extending between right vertical angled support member 108 and left vertical support member 110. cross-bar end 12 and the vertical angled support member 108 and 110 provide for additional support and bearing surfaces where the large radius corners 108a and 110b provide for quick and efficient drainage of members 108 and 110.

Figure 6:
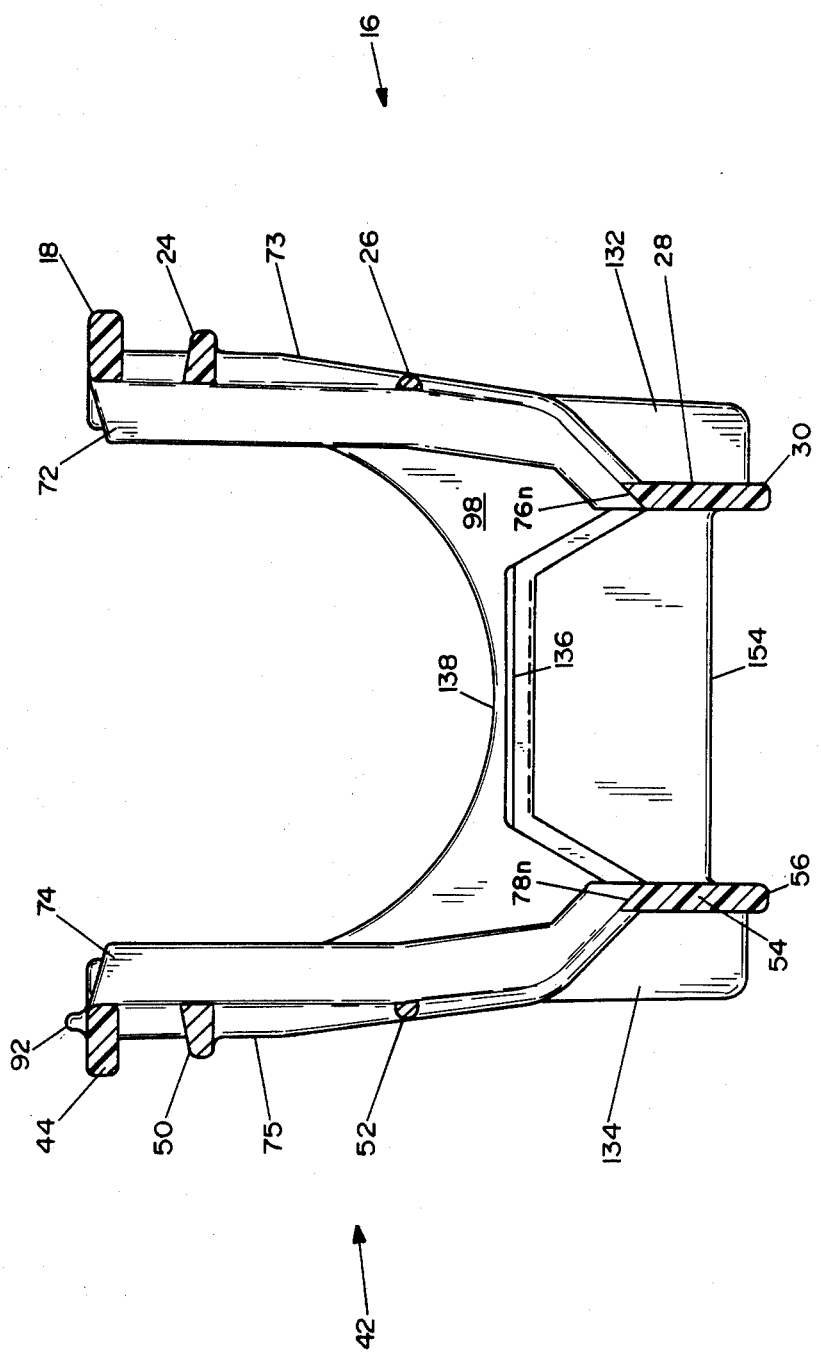
FIG. 6 illustrates a section view taken along line 6—6 of FIG. 2.

Support bars 112 and 114 position beneath upper edge members 18 and 44 and form, with the upper end surface of horizontal structure supports 24 and 50, handling slot recess 116 and 118. Handling slot recesses 120 and 122 are located above and inboard from support bars 112 and 114, located in the under surface of horizontal structure supports 18 and 44, respectively. Recessed handling slots 124 and 126, with sloped drain surfaces 124a and 126a, are positioned in the upper ends of angled vertical support members 108 and 110. Recessed handling slots 128 and 130, including sloped drain surfaces 128a and 130a, are positioned in the upper ends of angled vertical support members 132 and 134 of rear end 14. A beveled arched processing handle lip 136 positions across interior wall surface 98 just below inverted reverse arch 138, as also shown in FIG. 6, enhances structural support across rear end 14, between the angled vertical members 132 and 134 and also aids in drainage.

FIG. 2 illustrates a top view of the high profile wafer processing cassette 10 where all numerals correspond to those elements previously described. Particularly illustrated are wafers 140a–140n being supported in vertex radiused slots 68a–68n and 70a–70n, and resting upon lower slot vertex radiused support areas 76a–76n and 78a–78n in between wafer divider teeth 72a–72n and 74a–74n. The unique geometrical shape of the top portion of the dual cross-section profile divider teeth, with rounded exterior and interior tooth ends, are illustrated and also described in detail in FIGS. 5, 7, and 8. The locating pins 90 and 92 and locating slots 94 and 96 are positioned on and in upper edge members 44 and 18, respectively. Recess areas 120 and 122 and support bars 112 and 114 are shown beneath upper edge members 18 and 44. Beveled surfaces 20 and 22 and beveled surfaces 46 and 48 are illustrated at the ends of upper edge members 18 and 44 providing for minimum weight of the cassette 10. Processing handle lip 136 slopes downwardly and outwardly assisting in drainage, along upper surfaces, of process chemicals and washes toward drainage scuppers 140 and 142 draining the fluids to the outside the cassette. Drain holes 140 and 142 position upon beveled surfaces 141 and 143 adjacent to the corners formed by the junction of the interior end surface 98 with vertical angled supports 132 and 134 to aid in centrifugal drainage. Rounded end divider teeth 142–148 positioned on the upper surfaces of the angled vertical members 132 and 134 forming identification plaque slots 150 and 152.

FIG. 3 illustrates a front view of the end 12 where all numerals correspond to those elements previously described. In particular, the ramped rounded edge 102 of the cross-bar end 12, as well as the rounded edges 104 of the rectangular portion are illustrated, along with the supporting partial cylindrical rod 107. Support bars 112 and 114 and beveled horizontal structural supports 24 and 50, form handling slot recesses 116 and 118. Rounded exterior tooth edges 73a and 75a intersect with the horizontal upper edge members 18 and 44, upper horizontal beveled structural supports 24 and 50, lower partial rod supports 26 and 52 of FIGS. 1 and 5, and finally lower edge members 28 and 54 of FIG. 5, all of which contribute to structural support and strength of the wafer processing cassette 10. The vertical edges of angled vertical support members 108 and 110 provide bearing surfaces. The cassette 10 can be utilized in an upright position during automated wafer processing when the cassette is in a horizontal mode or in a vertical mode.

Figure 4:
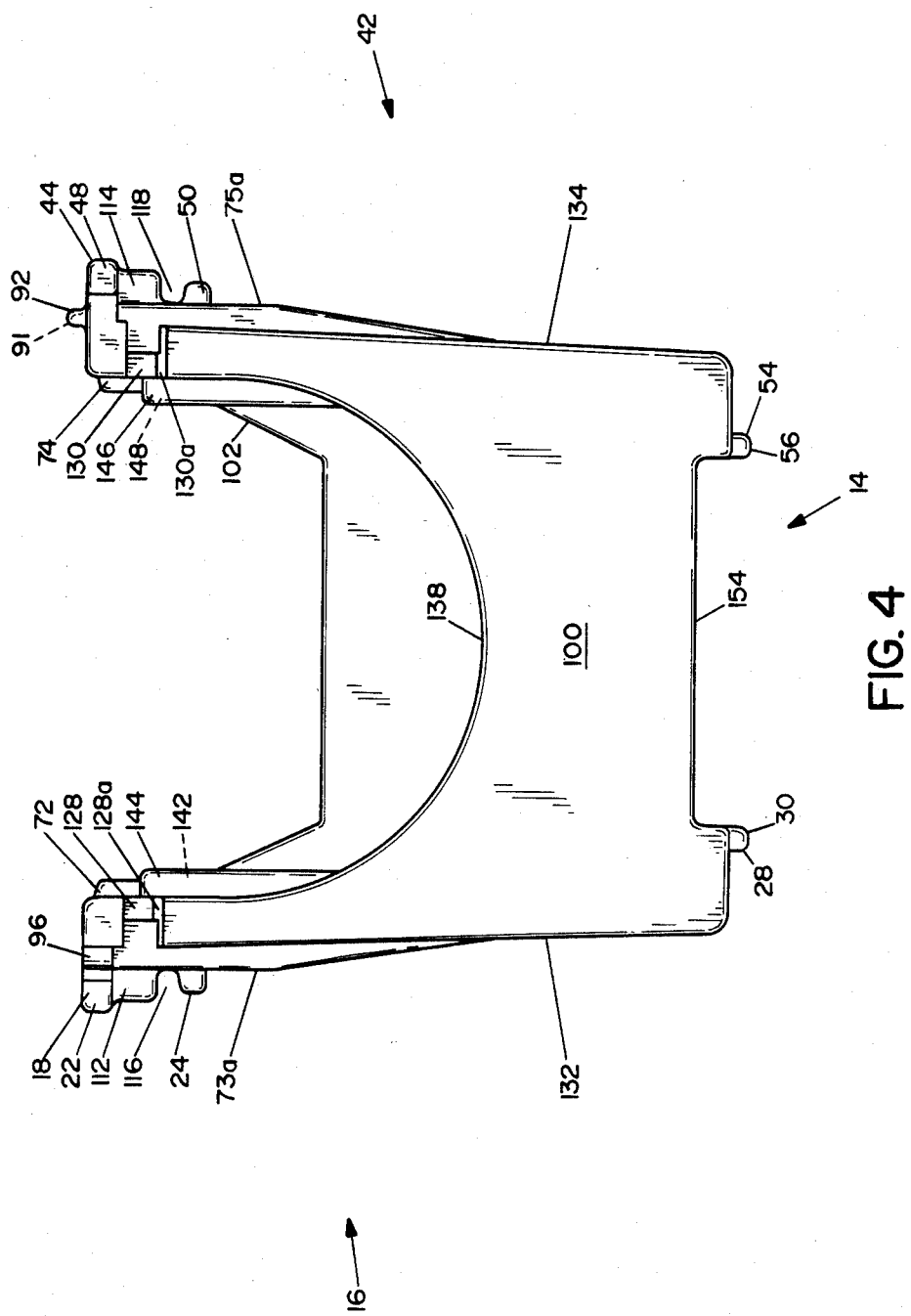
FIG. 4 illustrates a rear end view of the high profile cassette.

FIG. 4 illustrates a rear end 14 view of the cassette 10 where all numerals correspond to those elements previously described. Particularly illustrated is the rounded edge reversed arch 138, and the rounded open area above. Rounded edge 154 with the end portions of lower edge members 28 and 54 form a rectangular drainage and process handler recess. Vertical angled support members 132 and 134 join interior and exterior surfaces 98 and 100 with reversed arch 138, with the cassette 10 and provide, with lip 136, additional rear end structural support. Smooth surface 100 serves as a bearing surface.

Figure 5:
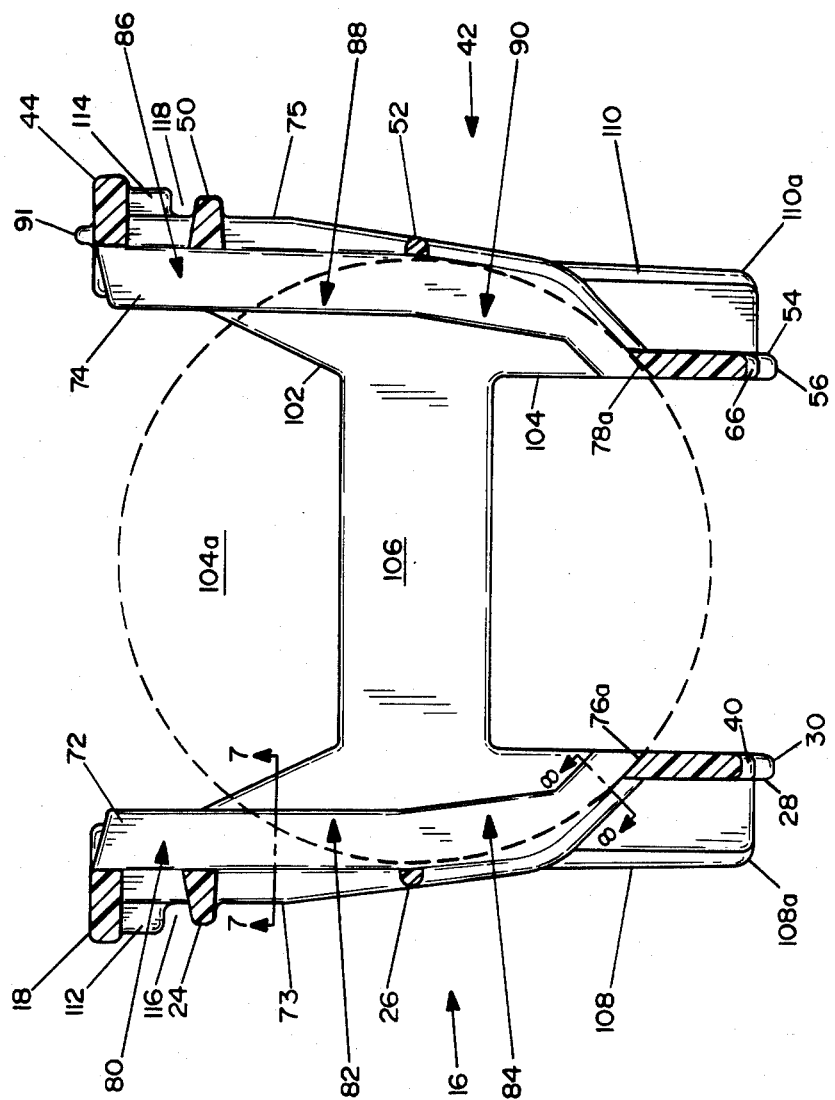
FIG. 5 illustrates a section view taken along line 5—5 of FIG. 2.

FIG. 5 particularly illustrates a section view taken along line 5—5 of FIG. 2 showing conforming radius wafer edge perimeter contact of the wafer 104a with conforming radiused support seat areas 76a-76n and 78a-78n. The seat areas have the same radius as the wafer 104. The wafers 104a-104n center in the rounded interior vertex indexing slots 68a-68n and 70a-70n formed by dual profile teeth 72a-72n and 74a-74n. Point contact of the wafer 104 at the partial cylinder support rods 26 and 52 is minimized for purposes of processing by automated robotic equipment. Multi-level process wash ports 80, 82, and 84 of right side 16, and multi-level process wash ports 86, 88 and 90 of left side 42, provide for maximized areas of fluid flow, pressurized process chemical or process wash entry, and exposure to those liquids. The tops of teeth 72 and 74 are ramped promoting and facilitating drainage of liquids from the cassette 10.

FIG. 6 illustrates a section view taken along line 6—6 of FIG. 2 showing an arch 136, with beveled radiused upper and lower edges, positioned upon interior surface 98 below inverted arch 138 of rear end 14, functioning as a rear end structure strengthener, while at the same time channeling processing fluid in the direction of drain scuppers 140 and 142, as shown in FIGS. 1 and 2, during the centrifugal cycles of the automated wafer processing equipment. The lip 136 accepts various processing handles for manual movement of the wafer cassette 10.

FIGS. 7 and 8 illustrate a section view of the dual profile divider teeth 74a-74n taken along line 7—7 of FIG. 5 and line 8—8 of FIG. 5, where all numerals correspond to those elements previously described. Dual profile teeth 72a-72n and similar like opposing teeth 74a-74n, not shown for sake of brevity, maintain a long upper cross-section profile dimension 160, as in FIG. 7, for a relatively long vertical distance above and near section line 8—8 for purposes of structural strength and integrity along its tall vertical cross-section. The teeth provide for sufficient and adequate wide multi-level wash port dimensions 156, such that the wash port dimension 156 and the process fluid passing through are not compromised by the use of a wider tooth width dimension 158. Compared to the upper portion of tooth, dimension 160 of the profile of the lower portion of tooth 72a-72n, at section line 8—8, of FIG. 5, is reduced in length, with respect to the reduced span length structural requirements, along the ramped ascent to meet the upper portion of tooth 72a-72n. Compared to the upper tooth, interior rounded teeth points 162a-162n and 164a-164n are reduced in radius in the lower tooth, while tooth width dimension 158 and wash port dimensions 156 remain constant in corresponding opposing teeth dividers in FIGS. 7 and 8. Rounded tooth backs 73a-73n and 75a-75n provide a wedge shape surface, such as in a pointed bow of a boat for example, for providing ease of entry of flow fluid or pressurized process spray liquid, the angles of which cause a sufficient amount of the liquid to be deflected inwardly from the angular wedge shape, in through the multi-level wash ports 80a-80n, 82a-82n, 84a-84n, 86a-86n, 88a-88n, 90a-90n, and into the cassette interior, making contact with wafers instead of deflecting directly backwards off of a non-wedge, such as a flat surface exterior tooth back, as found in prior art. The reduced cross-section 8—8 allows increased wafer exposure of the wafers lower portions to the chemical process liquid sprays.

MODE OF OPERATION

A representative wafer 104 is positioned in the wafer processing cassette 10 for processing by robotic automated processing equipment, the purpose of the present invention, although the cassette can also be used for purposes of transportation or for storage. The wafer cassette 10 can be utilized in present day on-center processing equipment. The wafer cassette 10 is unique, being functional for all types of processing equipment for integrated circuits in either a horizontal or vertical mode.

In this invention, the dividers supporting the wafers are supported by structure providing for maximized upper, middle, and lower level process washing ports for automated processing steps. Fluids, as well as air or gaseous vapors, can easily pass through the multiple open areas of the dividers and about and through the open ends, especially during chemical process or washing processes.

Virtually all flat surfaces and even rounded surfaces of the cassette are of an extremely smooth finish, all edges are rounded or radiused, all inner or outer corners are filled and/or smoothed, and drains and recesses are in use to provide for rapid egress and drainage of chemical or wash liquids from the interior and exterior surfaces of the cassette 10. The cassette is able to withstand chemicals, such as sulfuric acid or diluted acid or solvents such as freon.

Dual profile teeth used in the cassette lend added support for structural integrity along lengthy vertical tooth spans providing for sufficiently wide wash ports.

The partial cross-section area of rod 107 about the end provides for least weight of the cassette, as well as insuring structural integrity. The wafer processing cassette will carry twenty-five wafers, or any other number so configured.

Various modifications can be made to the present invention without departing from the apparent scope thereof.

I claim:

1. Wafer processing cassette comprising:
  a. inwardly angled, downwardly extending sides, each of which includes at least one horizontal support and at least two rows of wash slots being located at different horizontal levels a plurality of opposing dividers each having a tooth-shaped cross section and extending inwardly from each of said sides, said wash slots extending vertically between each of said dividers, lower edge members secured to each of said sides, each of said edge members including a conforming radius seat area for accepting a specific radius size of the wafer, each of said dividers having an upper portion located at upper wash slots and having a lower portion located at lower wash slots, the cross section of the upper portion being longer than the cross section of the lower portion, the cross section of the upper portion having facing interior side surfaces that are oriented at a smaller angle than facing interior side surfaces of the cross section of the lower portion;
  b. a rear end extending between said two sides and including an inverted large reversed arch extending downwardly; and, c. a front end member extending horizontally between said two sides, and including a partial section of a cylindrical rod.

2. Cassette of claim 1 wherein said horizontal supports include an upper and a lower horizontal support, each beveled in cross-section.

3. Cassette of claim 2 wherein said wash slots comprise three horizontal groups between said horizontal supports.

4. Cassette of claim 2 wherein said lower horizontal support is a rod extending adjacent to the outer edge of each of said dividers.

5. Cassette of claim 1 including a plurality of drains positioned at a lower portion of said rear end.

6. Cassette of claim 1 comprising integral channel means positioned on an interior side of said rear end for channeling fluid from said rear end to said drains.

7. Cassette of claim 1 comprising a plurality of fluid drainage slots in said lower edge members.

8. Cassette of claim 1 wherein said inwardly extending teeth of each of said dividers are radiusly vertexed.

9. Cassette of claim 1 wherein all surfaces are rounded and smooth, providing for rapid fluid flow and transfer.

* * * * *